United States Patent [19]

Takemura

[11] Patent Number: 5,572,046
[45] Date of Patent: Nov. 5, 1996

[54] SEMICONDUCTOR DEVICE HAVING AT LEAST TWO THIN FILM TRANSISTORS

[75] Inventor: Yasuhiko Takemura, Kanagawa, Japan

[73] Assignee: Semiconductor Energy Laboratory Co., Ltd., Japan

[21] Appl. No.: 365,744

[22] Filed: Dec. 29, 1994

Related U.S. Application Data

[62] Division of Ser. No. 266,712, Jun. 28, 1994, Pat. No. 5,403,762.

[30] Foreign Application Priority Data

Jun. 30, 1993 [JP] Japan .................................. 5-186891

[51] Int. Cl.$^6$ .......................... H01L 29/76; H01L 29/04; H01L 31/036; H01L 29/94
[52] U.S. Cl. .................. 257/66; 257/59; 257/72; 257/347; 257/350; 257/410; 359/57; 359/59
[58] Field of Search ................ 257/66, 59, 72, 257/347, 350, 351, 410, 411; 359/57, 59

[56] References Cited

U.S. PATENT DOCUMENTS

| | | | |
|---|---|---|---|
| 4,394,191 | 7/1983 | Wada et al. | 148/33.1 |
| 4,951,113 | 8/1990 | Huang et al. | 437/40 |
| 4,963,503 | 10/1990 | Aoui et al. | 437/44 |
| 5,032,531 | 7/1991 | Tsui et al. | 437/40 |
| 5,064,775 | 11/1991 | Chang | 437/40 |
| 5,202,274 | 4/1993 | Bae et al. | 437/40 |
| 5,231,039 | 7/1993 | Sakono et al. | 437/41 |
| 5,262,654 | 11/1993 | Yamazaki | 257/59 |
| 5,278,093 | 1/1994 | Yonemasa | 148/DIG. 154 |
| 5,287,205 | 2/1994 | Yamazaki et al. | 359/57 |
| 5,289,030 | 2/1994 | Yamazaki et al. | 257/410 |
| 5,294,555 | 3/1994 | Mano et al. | 437/41 |
| 5,306,651 | 4/1994 | Masumo et al. | 437/40 |
| 5,308,998 | 5/1994 | Yamazaki et al. | 257/66 |
| 5,317,432 | 5/1994 | Ino | 359/59 |
| 5,320,973 | 6/1994 | Kobayashi | 437/40 |
| 5,323,042 | 6/1994 | Matsumoto | 257/350 |
| 5,326,712 | 7/1994 | Bae | 148/DIG. 1 |

FOREIGN PATENT DOCUMENTS 0294519  4/1990  Japan ..................................... 257/66

*Primary Examiner*—Steven H. Loke
*Attorney, Agent, or Firm*—Sixbey, Friedman, Leedom & Ferguson; Gerald J. Ferguson, Jr.; Karlton C. Butts

[57] ABSTRACT

Two kinds of TFTs are fabricated by the same process with a high production yield to manufacture an active-matrix circuit and a peripheral driver circuit on the same substrate. The active-matrix circuit is required to have a high mobility and a high ON/OFF current ratio. The peripheral driver circuit needs a complex interconnection structure. The active-matrix circuit and the peripheral driver circuit comprising the TFTs are fabricated monolithically. In this step, the gate electrodes of the TFTs of the active-matrix circuit is coated with an anodic oxide on their top and side surfaces. The gate electrodes of the TFTs of the peripheral driver circuit is coated with the anodic oxide on only their top surfaces; substantially no anodic oxide is present on the side surfaces.

17 Claims, 2 Drawing Sheets

PERIPHERAL CIRCUIT REGION | PIXEL REGION

PERIPHERAL CIRCUIT REGION | PIXEL REGION

1

SEMICONDUCTOR DEVICE HAVING AT LEAST TWO THIN FILM TRANSISTORS

This is a divisional application of Ser. No. 08/266,712, filed Jun. 28, 1994, now U.S. Pat. No. 5,403,762.

FIELD OF THE INVENTION

The present invention relates to a method of fabricating an insulated gate semiconductor device or an integrated circuit comprising a multiplicity of insulated-gate semiconductor devices on an insulating substrate with a high production yield and also to a semiconductor device fabricated by such a method. Semiconductor devices according to the invention are used as thin-film transistors (TFTs) in a driver circuit for an active-matrix display such as a liquid crystal display, in a driver circuit for an image sensor, in an SOI integrated circuit, or in a conventional semiconductor integrated circuit (e.g., a microprocessor, a microcontroller, a microcomputer, a semiconductor memory, or the like). Furthermore, the invention relates to an integrated semiconductor device having an active-matrix in a broad sense (i.e., which comprises interconnections arranged in rows and columns, and in which a selecting circuit consisting of at least one transistor is disposed in each intersection) and a peripheral circuit for driving the active-matrix. In particular, the integrated semiconductor device comprises an active-matrix liquid-crystal display (AMLCD), DRAM, SRAM, EPROM, EEPROM, mask ROM, or other semiconductor integrated circuit formed on an insulating substrate.

BACKGROUND OF THE INVENTION

In recent years, researches on formation of insulated-gate semiconductor devices (MOSFETs) on an insulating substrate have been earnestly conducted. Such formation of a semiconductor integrated circuit on an insulating substrate is advantageous for high-speed operation, for the following reason. The speed of the prior art semiconductor integrated circuit has been mainly restricted by the stray capacitance between each conductive interconnect and the substrate. On the other hand, such stray capacitance does not exist on an insulating substrate. A MOSFET formed on an insulating substrate and having an active layer in the form of a thin film is known as a thin-film transistor (TFT). In the prior art semiconductor integrated circuit, TFTs are used as load transistors for an SRAM, for example.

Recently, a commercial product comprising a semiconductor integrated circuit which is required to be formed on a transparent substrate has emerged. Examples of this product include circuits for driving optical devices such as liquid crystal displays and image sensors. TFTs are also used in these driver circuits. Since these circuits are required to be formed in a large area, there is a demand for a decrease in the temperature of the TFT fabrication process. Furthermore, where a device has numerous terminals on an insulating substrate, if the terminals must be connected with a semiconductor integrated circuit, one might consider to form the first stage of the semiconductor integrated circuit or the semiconductor integrated circuit itself on the same insulating substrate monolithically to increase the packaging density.

Conventionally, the crystallinity of TFTs has been improved by annealing an amorphous, semi-amorphous, or crystallite semiconductor film at a temperature of 450°–1200° C. Thus, a good semiconductor film, i.e., having sufficiently high mobilities, is obtained. Some amorphous TFTs comprise a semiconductor film made of an amorphous material. However, their mobilities are lower than 5 $cm^2/V \cdot s$, normally as low as about 1 $cm^2/V \cdot s$. Their operating speed and inability to fabricate P-channel TFTs have restricted their use severely. Anneal at the above-described temperature has been needed to obtain TFTs having mobilities exceeding 5 $cm^2/V \cdot s$. Also, the anneal permitted fabrication of P-channel TFTs (PTFTs). These thermal annealing steps can be carried out by the use of irradiation of laser light or intense light.

However, it has been pointed out that these TFTs do not have sufficiently high reliability to be used in an active-matrix device because of large leakage current in OFF state. Accordingly, we have proposed improved methods as described in Japanese Patent application Ser. Nos. 34194/1992 and 30220/1992. Specifically, gate electrodes are made of a low-resistivity metal such as aluminum. The surface of each gate electrode is anodized so that the surface is coated with an oxide. Using this lamination of the metal and the oxide as a main mask, impurities are implanted to form an offset region. As a result, the leakage current is reduced. Also, the interlayer insulation is enhanced by the anodic oxide film. Consequently, short circuit at the crossing portions can be greatly reduced.

More specifically, the film of the anodic oxide has only a small number of pinholes and can withstand high voltages greater than 7 MV/cm. Hence, interlayer insulation is secured. In practice, we have succeeded in greatly reducing short circuit between interconnections, by utilizing the techniques described in the above-cited Japanese Patent application Ser. Nos. 34194/1992 and 30220/1992. This is quite important in active-matrix regions because interconnections cross each other at very numerous locations.

However, we have discovered that technically very difficult problems occur when one attempts to fabricate a device on which an active-matrix device and its peripheral driver circuit are monolithically formed (e.g., a memory or an AMLCD), using the above-described technique.

Generally, a peripheral circuit is complex in structure and has interconnects connected in a complex manner. Therefore, even if one attempts to coat metal electrodes with an anodic oxide, it is impossible to supply electric power because of the complexity of the interconnect structure. Also, if interconnects used only for supply of electric power are formed, then an extra photolithography step is necessary to remove these interconnects. This results in a decrease in the manufacturing yield. If a circuit is constructed together with these extra interconnects, then the device density is deteriorated severely.

In another proposed method, an anodic oxidation step is used to fabricate an active-matrix circuit portion. The anodic oxidation step is not employed when a peripheral circuit portion and other regions are formed. This method suffers from a very low production yield. It has been found that the main cause is the presence of numerous pinholes because the interlayer insulator is incomplete. The pinholes cause short circuits between an upper interconnect and a lower interconnect (i.e., a gate electrode and its interconnect).

This is an essential problem where interconnects of a metal having a low melting point are used. It is well known that aluminum and their alloys are excellent electrode materials. If impurity atoms are implanted into an active layer using gate electrodes made of such a material as a mask by a self-aligning process, then activation utilizing thermal annealing at a temperature of 630° C. or higher cannot be adopted. Therefore, it is inevitable that a low-temperature activation technique such as laser annealing is used to activate the impurity atoms. Furthermore, a technique of forming an interlayer insulator film above 560° C. cannot be adopted.

For example, an interlayer insulator material such as silicon oxide formed by LPCVD or atmospheric-pressure CVD at a substrate temperature above 560° C. contains a quite small number of pinholes. Also, almost no short circuit occurs between interconnects. However, at low temperatures below 560° C., only sputtering or plasma CVD can be used. In these methods, a large amount of dust is deposited onto the film during its growth. This increases the number of pinholes. Also, the resulting insulation is not satisfactory. Even in a peripheral driver circuit, interconnects cross each other. Therefore, in order to improve the production yield, there is a demand for a method of forming an anodic oxide with an improved production yield.

SUMMARY OF THE INVENTION

In view of the foregoing problems with the prior art techniques, the present invention has been made.

It is an object of the present invention to provide an optimum device structure and an optimum manufacturing process.

The techniques described in the above-cited Japanese Patent application Ser. Nos. 34194/1992 and 30220/1992 form an anodic oxide. As described in the patent specifications of these Japanese Patent applications, the greatest feature of these techniques is that when an inverse voltage is applied to each gate, the leakage current can be reduced greatly by the offset effect. This characteristic is necessary for TFTs in active-matrix regions which operate dynamically because of the necessity of holding pixel voltage with certainty. Also, the characteristic is necessary where the stand-by electric consumption of a flip-flop circuit should be suppressed. Therefore, where TFTs of this structure are used as pixel transistors of an AMLCD, as selecting transistors forming storage bits of a DRAM fabricated by SOI techniques, or as transistors forming an inverter circuit for the storage bits of an SRAM (especially a complete CMOS SRAM), great advantages can be obtained.

However, if peripheral circuits operate statically or partially statically, their leakage current presents no serious problems. Therefore, the circuits function satisfactorily even if an anodic oxide is not formed on the side surface, i.e., the offset structure is not adopted.

However, if a dense film as consisting of an anodic oxide is not formed on the top surface of the gate electrode, then leakage between interconnects greatly deteriorates the manufacturing yield. As described in the above-cited specifications, where laser annealing is utilized, the damage caused by the laser annealing step is minimized by the existence of an anodic oxide on the top surface of the gate electrode.

We know that a metal aluminum film fabricated by electron-beam evaporation has a flat surface and have submicrometer grain diameters. Therefore, the film well reflects light, especially UV light. After the film is directly irradiated with laser light, almost no damage was observed. However, after a film fabricated by sputtering or other similar method and having large grain sizes of about 1 μm is directly irradiated with laser radiation, very large damage was observed. Since electron-beam evaporation is not adapted for mass production, the practical approach is to use sputtering techniques. That is, for a peripheral circuit, the gate electrode needs an anodic oxide not on its side surface but on its top surface.

Accordingly, in a semiconductor device of the present invention, TFTs in which almost no anodic oxide exists on the side surface of each gate electrode but an anodic oxide is formed only on the top surface are formed together with TFTs of active-matrix regions. TFTs of this structure and a device made up of these TFTs are fabricated in the manner described below.

A metal film made of, for example, aluminum is deposited on a semiconductor layer becoming islands and on a gate-insulating film. An oxide film is formed on the metal film by anodic oxidation. Although the preferred thickness range of the oxide film depends on the quality of the oxide film, we have found that where the thickness of the oxide is less than 30 nm, the composition deviates from the stoichiometric ratio, thus deteriorating the insulation. Therefore, the thickness of the insulator (the oxide) is preferably 30 nm or more. Since a very high voltage is applied to the device in order to form the oxide to a thickness of 300 nm or more by the anodic oxidation, it is not preferred that the oxide is formed to a thickness of 300 nm or more.

Then, the oxide and the metal film are etched to form gate electrodes of a desired shape. Thus, the anodic oxide is left on the top surfaces of the gate electrodes, and no anodic oxide exists on the side surfaces in the peripheral circuit. By the later ion implantation or doping, the gate electrode of the transistor in the peripheral circuit can be made self-aligned with at least one of source and drain of the transistor in the peripheral circuit.

The above-described etching process should be a directional etching process such as reaction ion etching (RIE). Where an isotropic etching process is carried out, voids (cusp) are created near the boundary because of the difference in etch rate between the anodic oxide and the metal film. As a result, the interconnects extending over the voids easily break. However, depending on the material, the whole process can not be effected by RIE.

As an example, where the metal material is aluminum, the anodic oxide is aluminum oxide but this cannot be removed by RIE. Therefore, in this case, the aluminum oxide film is first removed by wet etching. Then, using the remaining aluminum oxide as a mask, the metal aluminum is etched by RIE.

If it is impossible to employ RIE for etching of the metal aluminum and the process relies only on wet etching, then it is desired to make the metal aluminum film as thin as possible. More specifically, the ratio between the aluminum oxide film thickness and the metal aluminum film thickness should be less than 1:3. Preferably, the ratio is less than 1:2.

A monolithic matrix circuit is built, using these TFTs, in the manner described below. A first method comprises the following steps: (1) A metal film is formed in matrix regions as well as in a peripheral circuit; (2) This metal film is anodized to form an anodic oxide on the surface; (3) The anodic oxide is removed from unwanted locations; (4) Using the remaining anodic oxide as a mask, the metal film is etched, and gate electrodes are formed in the peripheral circuit and in the matrix regions; and (5) An electrical current is caused to flow through the matrix regions to form an anodic oxide only on the side surface of each gate electrode of the matrix regions.

We now take notice of the matrix regions fabricated by this method. First, the anodic oxide is formed by the step (2). The second anodization is effected by the step (5) while leaving the anodic oxide on the gate electrode. Therefore, a stress is induced between the initially formed anodic oxide and the anodic oxide formed later. This may peel off the initially formed anodic oxide.

This problem can be avoided by adding a step (4') subsequently to the step (4) as shown in Example 1. This step (4') consists of removing the anodic oxide from the matrix regions while masking only the peripheral circuit portion. By carrying out this step, the metal material of the gate electrodes of the matrix regions is fully exposed. Then, a uniform anodic oxide is formed on the top and side surfaces by the step (5). It is easy to mask only the matrix regions. The production yield is not deteriorated in spite of the addition of the step (4'). However, even the gate-insulating film may be etched away, depending on the kind of the etchant used. If the semiconductor region surfaces are exposed, then the manufacturing yield will be deteriorated. Hence, care must be exercised. In any case, at least two anodization steps are necessary.

A second method according to the invention is the method of Example 2 and consists mainly of the following steps: (1) A metal film is deposited over the whole peripheral circuit portion, and a metal film is formed in the form of gate electrodes on the matrix regions; (2) An electrical current is caused to flow through the metal film on the peripheral circuit portion and through the gate electrodes and their interconnects of the matrix regions to form an anodic oxide; and (3) The anodic oxide and the metal film on the peripheral circuit portion are etched, and the gate electrodes of the peripheral circuit portion are formed.

This method involves only one anodization step but at least two photolithography steps are necessary in order to form the gate electrodes of the matrix regions and the gate electrodes of the peripheral circuit portion.

The impurities doped are activated in both the peripheral circuit and the active-matrix circuit by irradiating a laser light thereto.

Instead of this laser irradiation, a thermal annealing at 550° C. or lower may be used to activate the impurities doped. Alternatively, the substrate may be heated at a temperature of 200° to 500° C. during the laser irradiation. Further, these techniques may be combined. For example, the thermal annealing may be carried out after or before the laser irradiation. Further, the thermal annealings may be carried out twice, i.e. before and after the laser irradiation. The laser irradiation may be carried out maintaining the substrate substantially at room temperature. Alternatively, the laser irradiation may be carried out heating the substrate at a temperature of 200° to 500° C.

It is necessary to control the substrate temperature of the heating in the laser irradiation or the thermal annealing in order to prevent the gate electrode material from being damaged. The present invention prevents hillock (abnormal crystal growth) from forming in a perpendicular direction even though the annealing is carried out at a relatively high temperature, since the anodic oxide film is formed on the top surfaces of the gate electrodes of both the peripheral circuit and the active-matrix circuit (i.e. the pixel transistor circuit). Accordingly, short circuit is hardly formed between layers.

Other objects and features of the invention will appear in the course of the description thereof, which follows.

DETAILED DESCRIPTION OF THE INVENTION

EXAMPLE 1

Figure 1A:
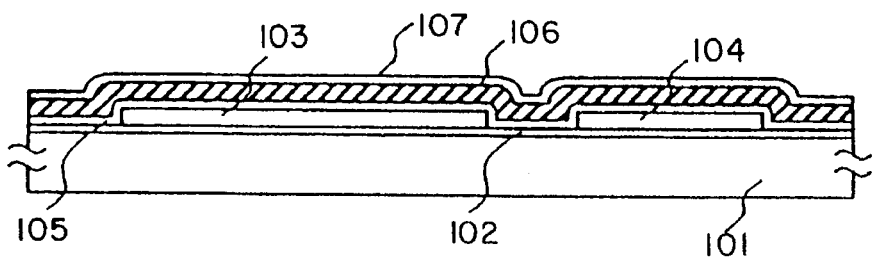
FIGS. 1(A) to 1(E) are cross-sectional views of TFTs according to the present invention, illustrating successive steps for fabricating the TFTs.

A bottom oxide film 102 having a thickness of 100 to 300 nm was formed on an insulating substrate 101 made of Corning 7059 measuring 300 mm×300 mm or 100 mm×100 mm. To form this oxide film, silicon oxide may be sputtered within an oxygen ambient. Alternatively, TEOS is decomposed by plasma CVD and a film is deposited. This film is then annealed at 450° to 650° C.

Thereafter, an amorphous silicon film having a thickness of 30–150 nm, preferably 50–100 nm, was deposited by plasma CVD or LPCVD. A protective layer consisting of silicon oxide or silicon nitride and having a thickness of 20 to 100 nm, preferably 20 to 40 nm, was formed by plasma CVD. Then, the amorphous silicon film was annealed at 550°–650° C., preferably at 600° C., for 72 hours to crystallize the amorphous silicon film. The crystallinity of the silicon film crystallized in this way was investigated by Raman spectroscopy. A relatively broad peak was observed near 515 cm$^{-1}$, which differed from the peak (521 cm$^{-1}$) of a single crystal of silicon.

The protective layer was then removed to expose the silicon layer. This silicon layer was subsequently photolithographically patterned into islands to form TFT regions 103 of a peripheral driver circuit and TFT regions 104 of an active-matrix circuit. A gate oxide film (gate insulating film) 105 having a thickness of 50 to 200 nm was formed on the islands of the silicon layer by sputtering within an oxygen ambient. Then, an aluminum film 106 having a thickness of 200 nm to 5 µm, preferably 200 to 600 nm, was formed as a conductive film over the whole surface of the substrate by electron-beam evaporation. This aluminum film was oxidized by anodization to form an anodic oxide 107 having a thickness of 30 to 300 nm, preferably 100 to 300 nm on the surface. The conditions under which the aluminum film was anodized were the same as the conditions used in the techniques described in Japanese Patent application Ser. Nos. 30220/1992, 38637/1992, and 54322/1992. An electrical current was caused to flow through the aluminum film within an electrolyte.

Figure 1B:
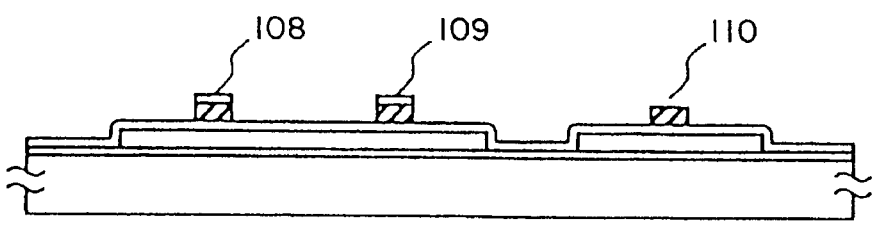

Then, as shown in FIG. 1(B), the anodic oxide was etched with an etchant consisting principally of hydrofluoric acid, e.g., 1/10 buffered HF. Using the remaining anodic oxide as a mask, the metal aluminum film 106 was etched by RIE. Then, masking the peripheral circuit regions, the anodic oxide on the gate electrodes of the active-matrix circuit portion was etched. In this way, the gate electrodes 108 (for NTFTs), 109 (for PTFTs), and gate electrodes 110 of the active-matrix circuit portion were derived (FIG. 1(B)).

Figure 1C:
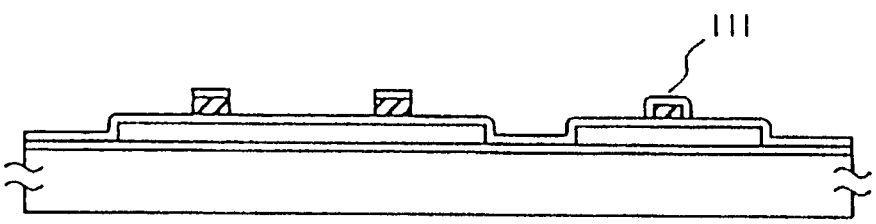

Subsequently, an electrical current was made to flow through only the gate electrodes of the active-matrix circuit portion within an electrolyte, and an anodic oxide 111 having a thickness of 30 to 300 nm, preferably 200 to 300 nm, e.g., 250 nm, was formed on the top and side surfaces of the gate electrodes of the active-matrix circuit under the same conditions as the foregoing (FIG. 1(C)). By the later ion implantation, the gate electrode of the transistor in the active-matrix circuit portion can be offset from at least one of source and drain of the transistor in the active-matrix circuit portion.

Then, using the gate electrode portions (i.e., the gate electrodes and the surrounding anodic oxide film) of the active-matrix circuit and the peripheral driver circuit as a mask, impurity ions were implanted into the silicon film islands of the TFTs by a self-aligning ion doping process. During this process, phosphorus ions in the form of phosphine ($PH_3$) were first implanted as a doping gas. Thereafter, only the left part of the illustrated island 103 was coated with a photoresist, and boron ions were implanted into the islands 103 and 104, using diborane ($B_2H_6$) as a doping gas. The dose of phosphorus ions was 2 to $8\times10^{15}/cm^2$. The dose of boron ions was 4 to $10\times10^{15}/cm^2$. The dose of boron ions was set larger than the dose of phosphorus ions.

Figure 1D:
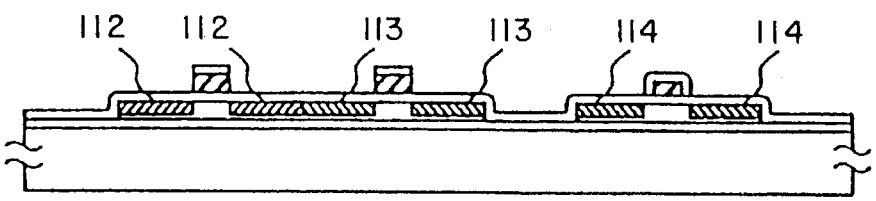

Thereafter, using the gate electrodes as a mask, the laminate was illuminated with a KrF excimer laser light having a wavelength of 248 nm and a pulse width of 20 nsec to recover the crystallinity of the portions which deteriorated due to the ion implantation described above. The energy density of the laser light was 200 to 400 $mJ/cm^2$, preferably 250 to 300 $mJ/cm^2$. As a result, N-type regions 112 and P-type regions 113 of a peripheral circuit and P-type regions 114 of an active-matrix circuit were formed. The sheet resistance of these regions was 200 to 800 $\Omega$/square. In this step, instead of irradiation of pulsed laser light emitted by a KrF excimer-laser, irradiation of intense light producing the same effects as the irradiation of the pulsed light may be adopted. This method is known as RTA (rapid thermal annealing) used to selectively heat a silicon semiconductor by making use of infrared light, especially infrared radiation having a peak at wavelengths of 1 to 2 µm. Preferably, the infrared light is halogen light of 1.3 µm. In this method, the doped regions can be heated to about 1000° to 1200° C. Thus, an anneal can be carried out effectively. Since such infrared radiation is selectively absorbed by the silicon semiconductor, the silicon film is annealed without thermally affecting the glass substrate. Another feature is that irradiation persisting for only several seconds to several minutes can produce desirable results. The structure obtained up to this state is shown in FIG. 1(D).

Then, a silicon oxide film having a thickness of 300 nm was formed as an interlayer insulator 115 over the whole surface by sputtering techniques. This insulator may be replaced by a silicon oxide film or a silicon nitride film formed by plasma CVD.

Figure 1E:
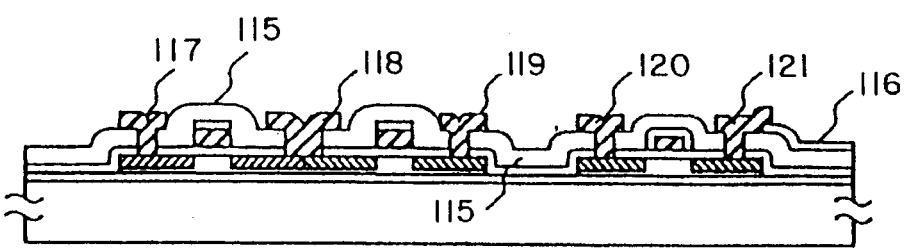

Thereafter, an ITO film was formed on the matrix portion by sputtering. The ITO film was etched to form pixel electrodes 116. Contact holes were formed on the source/drain electrodes of the TFTs. Chromium interconnects 117–121 having a thickness of 800 nm were formed by sputtering and photolithography, as shown in FIG. 1(E). In this case, an inverter circuit is built from NTFTs and PTFTs of the peripheral circuit regions. Finally, the silicon film was annealed at 350° C. within hydrogen for 2 hours to reduce dangling bonds in the silicon film. In this way, the peripheral circuit and the active-matrix circuit were fabricated integrally.

EXAMPLE 2

The process sequence of the present example is illustrated in FIG. 2, (A)–(E). A bottom silicon oxide film 202 having a thickness of 100 to 300 nm was formed on an insulating substrate 201 made of Corning 7059 measuring 300 mm×300 mm or 100 mm×100 mm. To form this oxide film, silicon oxide may be sputtered within an oxygen ambient. Alternatively, TEOS is decomposed by plasma CVD and a film is deposited. This film is then annealed at 450° to 650° C.

Figure 2A:
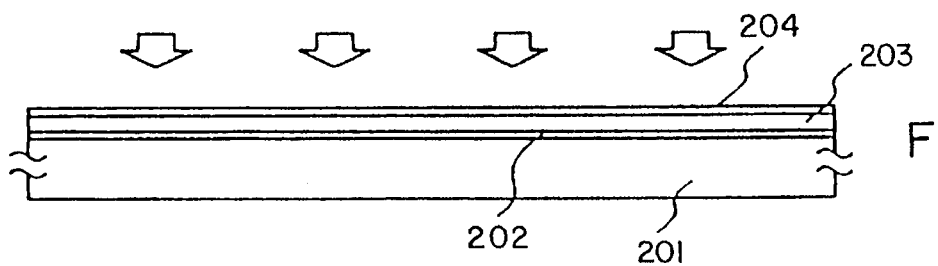
FIGS. 2(A) to 2(E) are cross-sectional views of other TFTs according to the invention, illustrating successive steps for fabricating the TFTs.

Thereafter, an amorphous silicon film 203 having a thickness of 30–150 nm, preferably 50–100 nm, was deposited by plasma CVD or LPCVD. A protective layer 204 consisting of silicon oxide or silicon nitride and having a thickness of 20 to 100 nm, preferably 50 to 70 nm, was formed by plasma CVD. Then, as shown in FIG. 2(A), the amorphous silicon film was illuminated with light emitted by a KrF excimer laser producing a wavelength of 248 nm and a pulse width of 20 nsec to improve the crystallinity of the silicon film 203. The energy density of the laser light was 200 to 400 $mJ/cm^2$, preferably 250 to 300 $mJ/cm^2$. The crystallinity of the silicon film 203 crystallized in this way was investigated by Raman spectroscopy. A relatively broad peak was observed near 515 $cm^{-1}$, which differed from the peak (521 $cm^{-1}$) of a single crystal of silicon. It is advantageous to illuminate the silicon film 203 with intense infrared light to promote the crystallization after the crystallization of the silicon film 203 by the KrF excimer laser irradiation. Since infrared light is selectively absorbed by the silicon semiconductor, the crystallization of the silicon film 203 can be effectively accelerated without heating the glass substrate to a large extent. In particular, defects and dangling bonds can be reduced. Also, crystallization can be carried out, using only irradiation of intense light. Then, the laminate was annealed at 350° C. for 2 hours in a hydrogen.

Then, the protective layer 204 was removed to expose the silicon layer 203. This silicon layer 203 was then photolithographically patterned into islands to form a peripheral circuit region and an active-matrix circuit region, in the same way as in Example 1. A gate oxide film (gate-insulating film) was formed on the islands of the silicon layer by effecting sputtering in an oxygen ambient or by annealing a film at 450° to 650° C., the latter film being obtained by decomposing TEOS by plasma CVD. Where the latter method is utilized, the high temperature used in the present step may induce strain in the substrate or cause it to shrink, thus making it difficult to perform later mask alignment. Therefore, where the substrate has a large area, sufficient care must be exercised. Where sputtering techniques are used, the substrate temperature can be set below 150° C. It is desired to anneal the film at about 300°–450° C. within hydrogen in order to reduce dangling bonds in the film and to reduce the effects of static charge.

Figure 2B:
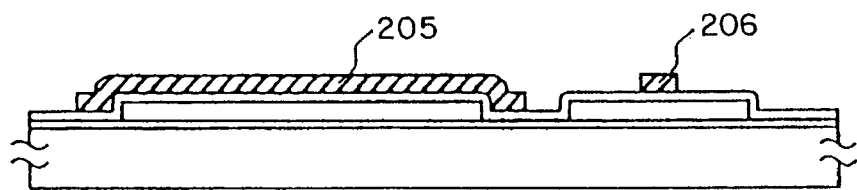

Thereafter, an aluminum film having a thickness of 200 to 500 nm was formed on the gate-insulating film by sputtering as a conductive film. This film was patterned photolithographically to form a metal aluminum coating 205 that covers the peripheral circuit region and gate electrodes 206 of the active-matrix regions and the wirings connected with the gate electrodes 206, as shown in FIG. 2(B).

Figure 2C:
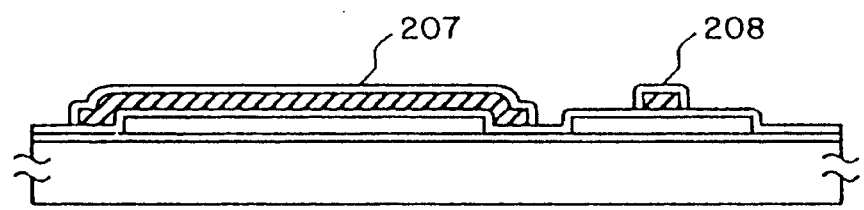

As shown in FIG. 2(C), the substrate was immersed in an electrolytic solution, and an electric current was caused to flow through the aluminum coating 205 and through the gate electrodes 206 and through the wirings connected with the gate electrodes 206 within an electrolyte, thus forming anodic oxide layers 207 and 208 on their surfaces and on their outer peripheries. In the present example, the thickness of the anodic oxide layers was 200 to 250 nm. As a result, the thickness of the remaining metal aluminum was 100 to 400 nm.

Figure 2D:
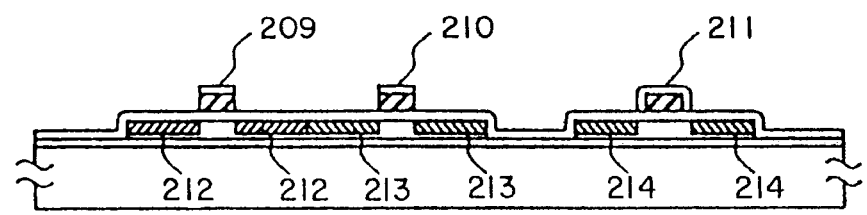
Figure 2E:
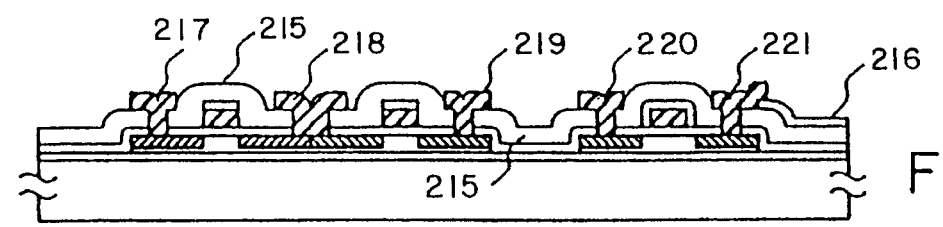

Then, as shown in FIG. 2(D), gate electrodes 209, 210 of TFTs of the peripheral circuit region were formed. First, the anodic oxide layer was etched by wet etching with an etchant consisting principally of hydrofluoric acid, e.g., 1/10 buffered HF. Then, using the remaining anodic oxide as a mask, the aluminum film was etched with mixed acid. Gate electrodes were formed in this way. As shown, the anodic oxide was left on the gate electrodes in the peripheral circuit region. On the other hand, the gate electrodes 211 of the TFTs of the active-matrix regions remained as it was.

Subsequently, using the gate electrode portions (i.e., the gate electrodes and the surrounding anodic oxide films) of the active-matrix circuit and the peripheral driver circuit as a mask, impurity ions were implanted into the silicon film islands of the TFTs by a self-aligning ion doping process. At this time, phosphorus ions in the form of phosphine ($PH_3$) were implanted as a doping gas into the whole surface. Then, only the left part of the illustrated peripheral circuit region was coated with a photoresist, and boron ions were implanted into the right part of the peripheral circuit region and into the matrix regions, using diborane ($B_2H_6$) as a doping gas. The dose of phosphorus ions was 2 to $8 \times 10^{15}/cm^2$. The dose of boron ions was 4 to $10 \times 10^{15}/cm^2$. The dose of boron ions was set larger than the dose of phosphorus ions.

Then, using the gate electrodes of the active-matrix circuit and the peripheral circuit as a mask, the amorphous silicon film was illuminated with light emitted by a KrF excimer laser producing a wavelength of 248 nm and a pulse width of 20 nsec to crystallize the portions whose crystallinity was deteriorated by the ion implantation. The energy density of the laser light was 200 to 400 $mJ/cm^2$, preferably 250 to 300 $mJ/cm^2$. This step may also be carried out by an anneal making use of irradiation of intense light or infrared light, that is a light equivalent to a laser light.

As shown in FIG. 2(D), N-type regions 212 and P-type regions 213, 214 were formed. The sheet resistance of these regions was 200 to 800 Ω/square. Then, a silicon oxide film having a thickness of 300 nm was formed as an interlayer insulator 215 over the whole surface by sputtering. This silicon oxide film may be replaced by a silicon nitride film formed by plasma CVD.

Thereafter, pixel electrodes 216 were fabricated from a transparent conductive material such as ITO on the TFTs of the active-matrix portion. Contact holes were formed on the source/drain of the TFTs. Chromium interconnects 217–221 were formed. In this case, an inverter circuit is built from NTFTs and PTFTs of the peripheral circuit region. Finally, the silicon film was annealed at 350° C. within hydrogen for 2 hours to reduce dangling bonds in the silicon film. In this way, the peripheral circuit and the active-matrix circuit were fabricated integrally.

[EXAMPLE 3]

This example is shown in FIG. 1. In the same manner as EXAMPLE 1, a TFT region 103 of a peripheral driving circuit and a TFT region 104 of a matrix circuit are formed of crystalline silicon on a substrate 101 on which a base film 102 has been formed. A gate oxide film 105 of 100 nm thickness is formed by a sputtering method in an oxygen atmosphere. Then an aluminum film 106 of 500 nm thickness is formed on the whole surface of the substrate by electron beam deposition method. This is oxidized by an anodic oxidation method, and anodic oxide 107 of 30 to 300 nm thickness, e.g., 100 nm thickness is formed on the surface. (FIG. 1(A))

As is shown in FIG. 1(B), the anodic oxide is etched with an etchant mainly comprising phosphoric acid (e.g., mixed solution of phosphoric acid, nitric acid, and acetic acid added with a minute amount of chromic acid by approximately 3%). The metal aluminum film 106 is etched by RIE with employing the residual anodic oxide as a mask. Furthermore, a mask is made in the peripheral circuit region, and anodic oxide on the gate electrode of the matrix circuit is etched. In this manner, gate electrodes of the peripheral driving circuit 108 (for NTFT) and 109 (for PTFT), and a gate electrode 110 of a matrix circuit portion are obtained. (FIG. 1(B))

After that, electric current is flowed in the gate electrode of the matrix circuit portion only in the same condition as above, anodic oxide 111 is formed on the upper surface and the side surface of said gate electrode by 200 to 300 nm thickness, e.g., 250 nm thickness. (FIG. 1(C))

By ion doping method, phosphorus and boron impurities are implanted into the island silicon film in self-aligning way with employing the gate electrode portion (i.e., the gate electrode and an anodic oxide film around it) as a mask.

While the substrate is heated at 200° to 500° C., e.g., at 350° C., KrF excimer laser light (wavelength 248 nm, pulse width 20 nsec) is irradiated. Above mentioned impurity region improves crystal character of the portion of which crystal character has been deteriorated by the ion implantation. Energy density of laser is made as 250 to 300 $mJ/cm^2$. As a result, an N type region 112 and a P type region 113 of a peripheral circuit, and a P type region 114 of a matrix circuit are formed. Sheet resistance of these regions is 200 to 400 Ω/square. Compared with Embodiment 1, dispersion is less. In Embodiment 1, activation is performed by laser irradiation without particularly heating the substrate. (FIG. 1(D))

After that, a silicon oxide film of 300 nm thickness is formed on the whole surface as an interlayer insulator 115 by a plasma CVD method. A pixel electrode 116 is formed of an ITO film, and chrome wirings 117 to 121 (all 800 nm thickness) are formed in source/drain of each TFT. (FIG. 1(E))

[EXAMPLE 4]

This example is shown in FIG. 1. In the same manner as EXAMPLE 1, a TFT region 103 of a peripheral driving circuit and a TFT region 104 of a matrix circuit are formed of crystalline silicon on a substrate 101 on which a base film 102 has been formed. A gate oxide film 105 of 100 nm thickness is formed by a sputtering method in an oxygen atmosphere. Then an aluminum film 106 of 500 nm thickness is formed on the whole surface of the substrate by electron beam deposition method. This is oxidized by an anodic oxidation method, and anodic oxide 107 of 30 to 300 nm thickness, e.g. 100 nm thickness is formed on the surface. (FIG. 1(A))

As is shown in FIG. 1(B), the anodic oxide is etched by an etchant mainly comprising phosphoric acid. The metal aluminum film 106 is etched by RIE with employing the residual anodic oxide as a mask. Furthermore, a mask is made in the peripheral circuit portion, and anodic oxide on the gate electrode of the matrix circuit is etched. In this manner, gate electrodes 108 (for NTFT) and 109 (for PTFT) of the peripheral driving circuit portion, and a gate electrode 110 of the matrix circuit portion are obtained. (FIG. 1(B))

After that, electric current is flowed in the gate electrode of the matrix circuit portion only. In the same condition as above, anodic oxide 111 is formed on the upper surface and the side surface of said gate electrode by 200 to 300 nm thickness, e.g. 250 nm thickness. (FIG. 1(C))

By ion doping method, phosphorus and boron impurities are implanted into an island silicon film of each TFT in self-aligning way with employing the gate electrode portion (i.e., the gate electrode and an anodic oxide film around this gate electrode) as a mask.

By performing heat annealing at 300° to 550° C., e.g. at 500° C. for 4 hours, doped impurities are activated. Then XeCl excimer laser (wavelength 308 nm, pulse width 20 nsec) is irradiated, thus enhancing activation. Energy density of laser is made as 250 to 300 mJ/cm$^2$. As a result, an N type region 112 and a P type region 113 are formed in the peripheral circuit, and a P type region 114 is formed in the matrix circuit. Sheet resistance of these regions is 200 to 400 Ω/square. Dispersion is not observed a lot. Because the source/drain region has been activated to some degree by heat annealing before laser irradiation, laser light is easy to be transmitted. Activation effect by irradiation of laser light gets in a portion deep in the source/drain. (FIG. 1(D))

After that, a silicon oxide film of 300 nm thickness is formed on the whole surface as an interlayer insulator 115 by plasma CVD method. A pixel electrode 116 is formed of an ITO film, and chrome wirings 117 to 121 (all 800 nm thickness) are formed in source/drain of each TFT. (FIG. 1(E))

In this embodiment, not only laser light irradiation but also heat annealing is utilized to activate doped impurities. Thus a device with high reliability with very little trap level in NI junction or PI junction between source/drain and channel is obtained.

[EXAMPLE 5]

This example is shown in FIG. 2. In the same manner as EXAMPLE 2, an amorphous silicon film 203 (50 nm thickness) and a silicon oxide or silicon nitride film 204 (50 nm thickness) are formed on a substrate 201 on which a base oxide film 202 has been formed. KrF excimer laser light (wavelength 248 nm, pulse width 20 nsec) is irradiated, and a silicon film 203 is crystallized. (FIG. 2(A))

The protection film 204 is removed, and a silicon film 203 is exposed. This silicon film is patterned into islands, thus a peripheral circuit region and an active matrix region are formed. Nextly, a gate oxide film is formed. An aluminum film of 500 nm thickness is formed by a sputter method, and is patterned. As is shown in FIG. 2(B), a metal aluminum film 205 covering the peripheral circuit region and a gate electrode 206 of the active matrix region are formed. (FIG. 2(B))

As is shown in FIG. 2(C), electric current is flowed to said aluminum film 205 and the gate electrode 206 with the substrate being immersed in an electrolyte solution. Anodic oxide films 207 and 208 are formed on the surface or around the aluminum film 205 and the gate electrode 206. In this embodiment, the thickness of the anodic oxide film is 200 to 250 nm. As a result, the thickness of the remaining metal aluminum is 200 to 400 nm. (FIG. 2(C))

As is shown in FIG. 2(D), gate electrodes 209 and 210 of TFT of the peripheral circuit are formed. First of all, the anodic oxide film is etched with an etchant mainly comprising phosphoric acid (e.g., mixed solution of phosphoric acid, nitric acid, and acetic acid added with a minute amount of chromic acid). Thereafter, the metal aluminum is etched with phosphoric acid with the remaining anodic oxide as a mask. In this manner, a gate electrode is formed. However, as is shown in the figure, anodic oxide is resided on these electrodes of the peripheral circuit. On the other hand, the gate electrode 211 of TFT of the active matrix region remains as it is.

By ion doping method, phosphorus and boron impurities are implanted into an island silicon film of each TFT in self-aligning way with employing the gate electrode portion (i.e., the gate electrode and an anodic oxide film around it) as a mask.

While the substrate is heated at 200° to 500° C., e.g., at 400° C., KrF excimer laser light (wavelength 248 nm, pulse width 20 nsec) is irradiated. Above mentioned impurity region improves crystal character of the portion of which crystal character has been deteriorated by the ion doping. By performing heat annealing at 300° to 550° C. thereafter, crystal character is further improved. (FIG. 2(D))

As a result, as is shown in FIG. 2(D), an N type region 212 and P type regions 213 and 214 are formed. Sheet resistance of these regions is 200 to 400 Ω/square. Dispersion is not observed a lot. In the heat annealing above mentioned, junction between source/drain and channel formation region to which laser light is difficult to penetrate, that is, Pi junction and NI junction are also activated. Thus characteristic is improved.

After that, a silicon oxide film of 300 nm thickness is formed on the whole surface as an interlayer insulator 215 by a plasma CVD method. A pixel electrode 216 is formed of an ITC) film, and chrome wirings 217 to 221 (all 800 nm thickness) are formed in source/drain of each TFT. (FIG. 2(E))

In this embodiment, heat annealing is utilized to activate doped impurity. Thus a device with high reliability with very little trap level in PI junction or NI junction is obtained.

[EXAMPLE 6]

This example is shown in FIG. 2. In the same manner as EXAMPLE 5, an amorphous silicon film 203 (50 nm thickness) and a silicon oxide or silicon nitride film 204 (50 nm thickness) are formed on a substrate 201 on which a base oxide film 202 has been formed. KrF excimer laser light (wavelength 248 nm, pulse width 20 nsec) is irradiated, and a silicon film 203 is crystallized. (FIG. 2(A))

The protection film 204 is removed, and a silicon film 203 is exposed. This silicon film is patterned into islands, thus a peripheral circuit region and an active matrix region are formed. Nextly, a gate oxide film is formed. An aluminum film of 500 nm thickness is formed. As is shown in FIG. 2(B), a metal aluminum film 205 covering the peripheral circuit region and a gate electrode 206 of an active matrix region are formed. (FIG. 2(B))

As is shown in FIG. 2(C), anodic oxide films 207 and 208 are formed in the same manner as EXAMPLE 5 by anodic oxidation. The thickness of the anodic oxide film is 200 to 250 nm. (FIG. 2(C))

The anodic oxide film 207 and the aluminum film 205 are etched, and then gate electrodes 209 and 210 of TFT of the peripheral circuit region are formed as is shown in FIG. 2(D).

By ion doping method, phosphorus and boron impurities are implanted into an island silicon film of each TFT in self-aligning way with employing the gate electrode portion (i.e., the gate electrode and an anodic oxide film around it) as a mask.

To activate the impurities, heat annealing is performed at 300° to 550° C., e.g., at 500° C. for four hours. KrF excimer laser light (wavelength 248 nm, pulse width 20 nsec) is irradiated to activate the doped impurities further, while keeping the substrate temperature at 200° to 500° C., e.g., 400° C. Characteristic of crystal is further improved by performing heat annealing at 300° to 550° C. e.g., 500° C. for four hours again. By the heat annealing after laser irradiation, defects generated in the device by the laser irradiation can be decreased. As a result, as is shown in FIG. 2(D), an N type region 212 and P type regions 213 and 214 are formed. (FIG. 2(D))

A silicon oxide film of 300 nm thickness is formed on the whole surface as an interlayer insulator 215 by a plasma CVD method. A pixel electrode 216 is formed of an ITC) film, and chrome wirings 217 to 221 (all 800 nm thickness) are formed in source/drain of each TFT. (FIG. 2(E))

The present invention makes it possible to fabricate TFTs having large OFF resistivities in active-matrix regions. Also, peripheral circuit regions having a complex structure can be fabricated with a high production yield. Furthermore, both kinds of regions can be manufactured monolithically by the same process. Accordingly, with respect to an AMLCD, the cost could be saved by more than 30% compared with the conventional case in which TAB connections were made. Conventional TFTs having high mobilities have the disadvantage that sufficient OFF resistivities cannot be obtained. Therefore, where a high-temperature process is used and TFTs of the same structure are used for both matrix and peripheral circuits, for example, the function of any one kind of TFTs would have been sacrificed.

On the other hand, in the method described in the above-cited Japanese Patent application Ser. No. 34194/1992 or 30220/1992, ideal TFTs having high mobilities and high OFF resistivities can be obtained. Consequently, an image can be displayed without difficulty even where high-speed operation and a high ON/OFF current ratio are required as encountered in a digital gray scale for which we filed patent applications (e.g., Japanese Patent application Ser. Nos. 169306/1991 and 209869/1991).

However, it is very difficult to fabricate a complex peripheral driver circuit from TFTs described in the above-cited Japanese Patent application Ser. No. 34194/1992 or 30220/1992. The present invention has completely solved these difficulties. Especially, the circuit configuration for the digital gray scale representation described above is quite complex because it requires more complex signal processing than ordinary display methods. Therefore, in the past, it has been required that the peripheral driver circuit be connected with ICs with TAB connections only because it is difficult perform an anodization step.

The present invention makes it possible to fabricate any complex peripheral circuit in such a way that its capability is hardly deteriorated. Of course, the invention is not limited to digital gray scale display. The invention can also be applied to LCDs utilizing ordinary analog gray scale representation. Especially, the best use of the invention is made where it is applied to an LCD with high information content displaying more than 1000 rows. In the illustrated examples, AMLCDs have been described. Obviously, the invention can be applied with similar utility to any device comprising an active-matrix circuit and a peripheral driver circuit in a broad sense (e.g., DRAMs and SRAMs). In this way, the invention is industrially quite advantageous.

What is claimed is:

1. A semiconductor device comprising:

(a) a first transistor comprising:

a first semiconductor region;

a first gate electrode provided adjacent to said first semiconductor region with a first gate insulating film therebetween; and a first oxide of a material of said first gate electrode provided on side and top surfaces of said first gate electrode, and (b) a second transistor comprising:

a second semiconductor region;

a second gate electrode provided adjacent to said second semiconductor region with a second gate insulating film therebetween; and a second oxide of a material of said second gate electrode provided only on a top surface of said second gate electrode, wherein substantially no oxide of said material of said second gate electrode is provided on a side surface of said second gate electrode.

2. The device of claim 1 wherein said material of said first gate electrode and said material of said second gate electrode comprise a conductive material.

3. The device of claim 2 wherein said conductive material comprises a metal.

4. The device of claim 2 wherein said conductive material comprises aluminum.

5. The device of claim 1 further comprising an insulating material which is different from said first oxide and said second oxide and is provided in contact with said side surface of said second gate electrode.

6. The device of claim 1 wherein said device is an active-matrix display, a microprocessor, a microcontroller, a microcomputer or a semiconductor memory.

7. A semiconductor device comprising:

(a) a first group of transistors each comprising:

a first semiconductor region;

a first gate electrode provided adjacent to said first semiconductor region with a first gate insulating film therebetween; and a first oxide of a material of said first gate electrode provided on side and top surfaces of said first gate electrode, and (b) a second group of transistors each comprising:

a second semiconductor region;

a second gate electrode provided adjacent to said second semiconductor region with a second gate insulating film therebetween, and a second oxide of a material of said second gate electrode provided on only a top surface of said second gate electrode;

wherein substantially no oxide of said material of said second gate electrode is provided on a side surface of said second gate electrode.

8. The device of claim 7 wherein said material of said first gate electrode and said material of said second gate electrode comprise a conductive material.

9. The device of claim 8 wherein said conductive material comprises a metal.

10. The device of claim 8 wherein said conductive material comprises aluminum.

11. The device of claim 7 further comprising an insulating material which is different from said first oxide and is provided in contact with said side surface of said second gate electrode.

12. The device of claim 7 wherein said device is an active-matrix display, a microprocessor, a microcontroller, a microcomputer or a semiconductor memory.

13. A semiconductor device comprising:

an insulating substrate;

a plurality of transistors provided on the insulating substrate and having gate electrodes and interconnects comprising a conductive material;

an active-matrix portion composed of a first group of the transistors, gate electrodes of the transistors of the first group each having a film comprising an oxide of said conductive material on side and top surfaces thereof; and a peripheral driver circuit portion composed of a second group of the transistors, a gate electrode of each of the transistors of the second group having a film comprising said oxide of said conductive material only on a top surface of said gate electrode and having substantially no oxide of said conductive material on a side surface of said gate electrode.

14. The device of claim 13 wherein said conductive material comprises a metal.

15. The device of claim 13 wherein said conductive material comprises aluminum.

16. The device of claim 13 further comprising an insulating material which is different from said oxide of said conductive material and is provided in contact with said side surfaces of said gate electrodes of the transistors of the second group.

17. The device of claim 13 wherein said device is an active-matrix display, a microprocessor, a microcontroller, a microcomputer or a semiconductor memory.

* * * * *